United States Patent [19]
Hata et al.

[11] Patent Number: 5,953,598
[45] Date of Patent: Sep. 14, 1999

[54] THIN FILM TRANSISTOR AND FABRICATION PROCESS OF THE SAME

[75] Inventors: Akihiro Hata, Tenri; Masahiro Adachi, Nara, both of Japan

[73] Assignee: Sharp Kabushiki Kaisha, Osaka, Japan

[21] Appl. No.: 08/689,892

[22] Filed: Aug. 15, 1996

[30] Foreign Application Priority Data

Oct. 9, 1995 [JP] Japan ................................. 7-261897

[51] Int. Cl.$^6$ ................................................. H01L 21/00
[52] U.S. Cl. ........................ 438/164; 438/257; 438/535; 438/151
[58] Field of Search ............................. 438/25, 151, 166, 438/257, 535, 30, 163, 164

[56] References Cited

U.S. PATENT DOCUMENTS

| | | | |
|---|---|---|---|
| 5,439,837 | 8/1995 | Hata et al. | 438/151 |
| 5,482,871 | 1/1996 | Pollack | 438/151 |
| 5,648,277 | 7/1997 | Zhang et al. | 438/151 |

FOREIGN PATENT DOCUMENTS 5-235031  9/1993  Japan .

OTHER PUBLICATIONS

H. Ohshima et al., "Full–Color LCDs with Completely Integrated Drivers Utilizing Low–Temperature Poly–Si TFTs", *SID 93 Digest* (1993), pp. 387–390.

*Primary Examiner*—Peter Toby Brown
*Assistant Examiner*—Khanh Duong
*Attorney, Agent, or Firm*—Dike, Bronstein, Roberts & Cushman, LLP; David G. Conlin; George W. Neuner

[57] ABSTRACT

A fabrication sequence of a thin film transistor, in which a photoresist film is used as an ion doping mask to shield a portion of an amorphous semiconductor layer larger than a gate electrode formed above in width (gate length). The mask is designed by pre-calculating the accuracy of the alignment and etching, so that the gate electrode overlaps neither the source region nor drain region. Thus, it has become possible to form the gate electrode in such a manner not to overlap the source region or drain region while securing an impurity-free offset region. As a result, the present thin film transistor can reduce the OFF-state current and renders excellent OFF-state characteristics, and therefore, when employed in a liquid crystal display device, the resulting liquid crystal display device can prevent display defects, such as a flicker.

8 Claims, 15 Drawing Sheets

THIN FILM TRANSISTOR AND FABRICATION PROCESS OF THE SAME

FIELD OF THE INVENTION

The present invention relates to a thin film transistor employed in an active matrix type liquid crystal display device or the like and a fabrication process of the same, and more particularly, to a thin film transistor having an offset region and a fabrication process of the same.

BACKGROUND OF THE INVENTION

Applications of thin film transistors (TFT's) to image display elements of a flat panel display or the like have been actively developed in recent years. Of all types of thin film transistors, those employed in an active matrix type liquid crystal display or the like must meet the following demands: high mobility, high ON/OFF-state current ratio, resistance to high voltage, downsized elements, etc.

Polycrystalline semiconductor TFT's are advantageous over those comprising amorphous semiconductor films in terms of large conductance. However, the polycrystalline semiconductor TFT's have a drawback that their processing temperature is as high as 1000° C. Thus, crystallization technology using a laser anneal technique has been actively studied or applied to obtain a polycrystalline semiconductor film at a processing temperature of 600° C. or below.

FIG. 12 is a bottom view showing a part of a panel substrate of a liquid crystal display device having a plurality of conventional thin film transistors 100's comprising polycrystalline semiconductor films. FIG. 13 is a cross section taken on line E—E of FIG. 12, and FIGS. 14(a) through 14(h) show a fabrication sequence of the thin film transistor 100.

In the fabrication sequence of the thin film transistor 100, as shown in FIG. 14(a), an amorphous semiconductor film (α-Si) 102a is formed on a glass substrate 101 to begin with, and the amorphous semiconductor film 102a is developed into a polycrystalline semiconductor film 102b, through, for example, irradiation of an excimer laser beam (FIG. 14(b)). Then, the polycrystalline semiconductor film 102b is formed into a predetermined pattern (FIG. 14(c)). Next, a mask is made out of a photoresist film 103 on the polycrystalline semiconductor film 102b over a portion which will be made into a channel region, and impurity ions are doped into the polycrystalline semiconductor film 102b (ion doping) using the mask of the photoresist film 103 as a doping mask (ion implantation mask) (FIG. 14(d)). Then, after the photoresist film 103 is removed, the ions are activated and diffused through, for example, irradiation of an excimer laser beam to form a source region 104a and a drain region 105a (FIG. 14(e)). Next, a gate dielectric film 106 and a metal film are formed sequentially, and the metal film is made into a predetermined pattern to form a gate electrode 107 (FIG. 14(f)). After an interlayer dielectric film 108 is formed, the interlayer dielectric film 108, together with the gate dielectric film 106, is formed into a predetermined pattern to make contact holes 109's (FIG. 14(g)). Then, another metal film is formed and the same is made into a predetermined pattern to form a source electrode 104 and a drain electrode 105 (FIG. 14(h)). Further, a pixel electrode 110 is formed near the transistor thin film 100 thus fabricated in such a manner to have physical contact with the drain electrode 105 (FIGS. 12 and 13). The pixel electrode 110 is made of a transparent conductive film, such as an ITO film.

In the field of the liquid crystal display devices, a technique such that forms an auxiliary capacitance in parallel to a liquid crystal capacitance in each pixel is known to improve data withholding characteristics. To be more specific, this is a technique to minimize a voltage drop by connecting the auxiliary capacitance electrode to the thin film transistor in series, while connecting the same to the capacitance of the liquid crystal cell in parallel. A technique to make either electrode of the auxiliary capacitance out of polysilicon is described in pages 387–390, SID1993DIGEST.

To save the costs of fabricating the thin film transistors, various methods have been proposed to simplify the fabrication sequence, and an example of which is disclosed in Japanese Laid-open Patent Application No. 5-235031 (1993). In the reference, as shown in FIG. 15(a), an amorphous semiconductor film 102a is formed on a glass substrate 101 to begin with, and a mask is made out of a photoresist film 103 on the amorphous semiconductor film 102a over a portion which will be made into a channel region. Then, impurity ions are doped into the amorphous semiconductor film 102a using the mask of the photoresist film 103 as a doping mask to form impurity doped regions 111's (FIG. 15(b)). After the photoresist film 103 is removed, for example, an excimer laser beam is irradiated so that the ion doped regions 111's are activated, and concurrently, the amorphous semiconductor film 102a is developed into a polycrystalline semiconductor film 102b (FIG. 15(c)). Then, The polycrystalline semiconductor film 102b is made into a predetermined pattern to form the channel region and the activated impurity doped regions 111's, which will be made into the channel region, a source region 104, and a drain region 105a, respectively (FIG. 15(d)). Next, a gate dielectric film 106 and a metal film are formed sequentially (FIG. 15(e)), and the metal film is made into a predetermined pattern to form a gate electrode 107. Similar steps to those explained with reference to FIGS. 14(f) through 14(h) are carried out thereafter to fabricate a thin film transistor. In the above fabrication process, the impurity ions may be doped into the amorphous semiconductor 102a through the ion implantation after the amorphous semiconductor film 102a is made into a predetermined pattern.

According to the above fabrication process, in the first place, the impurity is doped into the amorphous semiconductor 102a through the ion implantation to form the impurity doped regions 111's which will be made into the source region 104a and drain region 105a, respectively. In the second place, the amorphous semiconductor film 102a is polycrystalized and the impurity doped regions 111's are activated concurrently through irradiation of the excimer laser beam, for example. In short, both the polycrystalization and impurity activation are completed, for example, by irradiating an excimer laser beam once, thereby making it possible to simplify the fabrication sequence.

In either fabrication process above, the impurity doped regions are made first, and thence the gate electrode is formed on the upper layer of the channel region portion through the gate dielectric film.

However, in the practical process, the photomask becomes misaligned due to thermal contraction of the glass substrate or the like, and as shown FIG. 16, the gate electrode 107 may sometimes overlap the upper layer of the impurity doped region (source region 104a or drain region 105a) in the resulting thin film transistor. Such a thin film transistor characteristically attains a low breakdown voltage at the junction of the source portion or drain portion, and therefore, causes an increase in an OFF-state current. Thus, if such a thin film transistor is employed as a switching element of the pixel electrode of an active matrix type liquid crystal display device, there occurs display defects, such as a flicker.

SUMMARY OF THE INVENTION

It is therefore an object of the present invention to provide a thin film transistor which can reduce an OFF-state current, and thereby renders excellent OFF-state characteristics while being suitably employed in a liquid crystal display device, and to provide a fabrication process of the same.

To fulfill the above object, a fabrication process of a thin film transistor of the present invention is composed of the steps of:

forming an amorphous semiconductor layer on a dielectric substrate;

making an impurity doped region by carrying out ion doping while shielding a portion of the amorphous semiconductor layer that contains at least a region over which a gate electrode will be formed, the shielded portion being larger than the gate electrode formed above in width; and making a drain region and a source region by crystallizing the amorphous semiconductor layer and activating the impurity doped region, both the crystallization and impurity activation being carried out concurrently through irradiation of a laser beam or heating after the shielding is cleared.

According to the above fabrication process, when the ion doping is carried out, a photoresist film or the like is used as a doping mask to shield a portion of the amorphous semiconductor layer containing a region over which the gate electrode will be formed, and the shielded portion is larger than the gate electrode in width (gate length). The mask, which determines the size of the shielded portion, is designed by pre-calculating the accuracy of the alignment and etching, so that the gate electrode does not overlap the impurity doped region. Therefore, carrying out ion doping using the mask thus designed precludes the overlap of the gate electrode and impurity doped region.

Consequently, the above fabrication process can prevent the degradation of the characteristics, especially the OFF-state characteristics, of the resulting thin film transistor and reduce an OFF-state current of the same. When the thin film transistor fabricated by the above fabrication process is employed as a switching element of a pixel electrode of an active matrix type liquid crystal display device, display defects, such as a flicker, can be prevented.

Further, designing the doping mask by pre-calculating the accuracy of the alignment and etching as previously mentioned makes it possible to form dopant(impurity)-free offset regions respectively between the drain and source regions and a region over which the gate electrode will be formed. Accordingly, electric field concentration at the PN junction between the source region and drain region is relieved, thereby further reducing the OFF-state current and a jump in the OFF-state current.

As a result, it has become possible to provide a thin film transistor suitably employed in a liquid crystal display device.

After the amorphous semiconductor layer is crystallized and the impurity doped region is activated, it is preferable to further carry out second ion doping at a lower concentration than the first ion doping using the gate electrode formed above as shielding means. Accordingly, regions having a lower dopant concentration than the drain and source regions, or namely, LDD (Lightly Doped Drain) regions, are made respectively between the drain and source regions and the region over which the gate electrode is formed. Since the second ion doping is carried out in these particular regions using the gate electrode as a mask, that is, through a so-called self-alignment method, the LDD regions and gate electrode never overlap.

In a thin film transistor having such a LDD structure, not only the OFF-state current can be reduced but also an ON-state current drop can be suppressed. Thus, it has become possible to provide a thin film transistor rendering excellent ON- and OFF-state characteristics.

It is preferable that the dopant concentration of the LDD regions is in a range between 1/100 and 1/10000 of the dopant concentration of the drain and source regions. This arrangement makes it possible to fabricate a thin film transistor rendering desired characteristics.

Further, it is preferable that either the drain region or source region has an extended portion and make the extended portion into either electrode of a capacitor fabricated on the substrate on which the thin film transistor is also fabricated. Thus, when the thin film transistor and capacitor are fabricated on the same substrate, the above arrangement makes it possible to form at least either electrode of the capacitor concurrently with the drain region and source region of the thin film transistor.

When a plurality of thin film transistors and a plurality of capacitors are fabricated on the panel substrate of an active matrix type liquid crystal display device, in other words, a thin film transistor is fabricated as a switching element of each pixel electrode while a capacitor is fabricated as an auxiliary capacitance connected in parallel to the liquid crystal capacitance of each pixel, the latter can be fabricated concurrently with the former in a single sequence. More specifically, a scanning signal line constituting an integral part of the gate electrode of the thin film transistor is formed to also serve as the other electrode of the capacitor, and the gate dielectric film of the thin film transistor and a dielectric material interposed between the two electrodes of the capacitor are formed concurrently. Fabricating the capacitor (s) concurrently with the thin film transistor(s) in a single sequence can simplify the overall fabrication sequence.

Also, to fulfill the above object, a thin film of the present invention is provided with:

a drain region and a source region, both the regions being made by doping a dopant into a portion of a semiconductor layer, the semiconductor layer being formed on a dielectric substrate in a predetermined shape;

a gate electrode formed over a region of the semiconductor layer sandwiched by the drain region and source region, the gate electrode being smaller than the region in width; and two dopant-free regions made in two opposing sides of a region in the semiconductor layer below the gate electrode, respectively, wherein one of the drain region and source region has an extended portion, the extended portion being provided as either electrode of a capacitor provided on the above substrate.

According to the above arrangement, dopant(impurity)-free offset regions can be made respectively in two opposing sides of a region of the semiconductor layer below the gate electrode. As a result, the degradation of the characteristics, especially the OFF-state characteristics, of the thin film transistor can be prevented. In addition, not only the OFF-state current, but also a jump in the OFF-state current can be reduced. Thus, when the resulting thin film transistor is employed as a switching element of a pixel electrode in an active matrix type liquid crystal display device, display defects, such as a flicker, can be prevented.

Further, in a liquid crystal display with enhanced data withholding characteristics by having the thin film transistor and auxiliary capacitance in each pixel on the panel substrate, employing the above thin film transistor makes it possible to fabricate the auxiliary capacitance(s) concurrently with the thin film transistor(s) in a single sequence, thereby simplifying the overall fabrication sequence. To be more specific, an extended portion of either the drain region or source region of the thin film transister is formed to serve as either electrode of the capacitor concurrently with the drain and source regions. Further, the dielectric material and the other electrode of the capacitor are formed concurrently with the gate dielectric film and gate electrode of the thin film transistor, respectively. This arrangement enables each pixel to upgrade the data withholding characteristics without increasing the number of the fabrication sequence steps.

As a result, it has become possible to provide a thin film transistor suitably employed in a liquid crystal display device.

Further, to fulfill the above object, a thin film transistor of the present invention is provided with:

a drain region and a source region, both the regions being made by doping a dopant into a portion of a semiconductor layer, the semiconductor layer being formed on a dielectric substrate in a predetermined shape;

a gate electrode formed over a region of the semiconductor layer sandwiched by the drain region and source region, the gate electrode being smaller than the region in width; and two regions made in two opposing sides of a region in the semiconductor layer below the gate electrode, respectively, the two regions having a lower dopant concentration than the drain region and source region, wherein one of the drain region and source region has an extended portion, the extended portion being provided as either electrode of a capacitor provided on the above substrate.

According to the above arrangement, regions having a lower dopant concentration than the source and drain regions, or namely, LDD (Lightly Doped Drain) regions, can be made respectively in two opposing sides of a region of the semiconductor layer below the gate electrode. This arrangement makes it possible to reduce the OFF-state current and suppress an ON-state current drop. Therefore, the resulting thin film transistor renders excellent ON- and OFF-state characteristics. Thus, when the above thin film transistor is employed as a switching element in an active matrix type liquid crystal display device, display defects, such as a flicker, can be prevented.

Further, in a liquid crystal display device having the thin film transistor and auxiliary capacitance for each pixel on the panel substrate, employing the above thin film transistor makes it possible to fabricate the auxiliary capacitance(s) concurrently with the thin film transistor(s) in a single sequence, thereby simplifying the overall fabrication sequence. To be more specific, an extended portion of either the drain region or source region of the thin film transistor is formed to serve as either electrode of the capacitor concurrently with the drain and source regions. Further, the dielectric material and the other electrode of the capacitor are formed concurrently with the gate dielectric film and gate electrode of the thin film transistor, respectively. This arrangement enables each pixel to upgrade the data withholding characteristics without increasing the number of the fabrication sequence steps.

As a result, it has become possible to provide a thin film transistor suitably employed in a liquid crystal display device.

For a fuller understanding of the nature and advantages of the invention, reference should be made to the ensuing detailed description taken in conjunction with the accompanying drawings.

DESCRIPTION OF THE EMBODIMENTS

First Embodiment

Figure 1A:
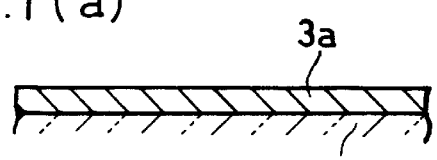
FIGS. 1(*a*) through 1(*h*) are views showing a fabrication sequence of a thin film transistor in accordance with an example embodiment of the present invention.
Figure 1B:
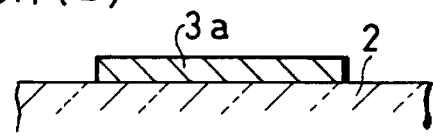
Figure 1C:
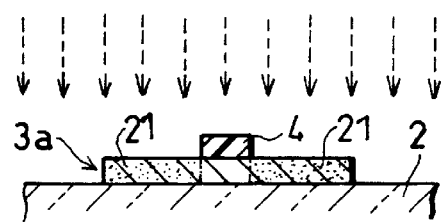
Figure 1D:
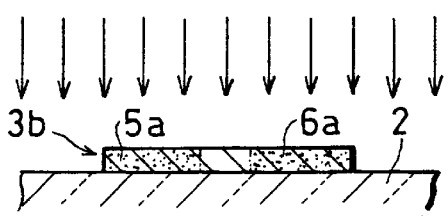
Figure 1E:
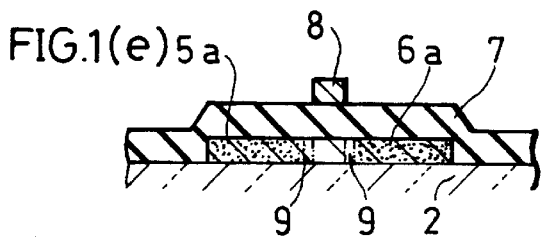
Figure 1F:
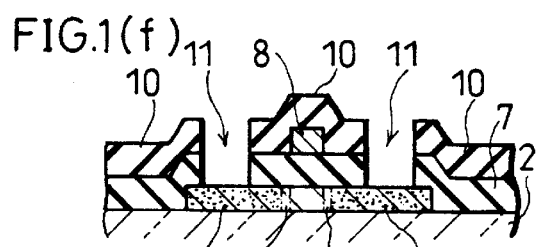
Figure 1G:
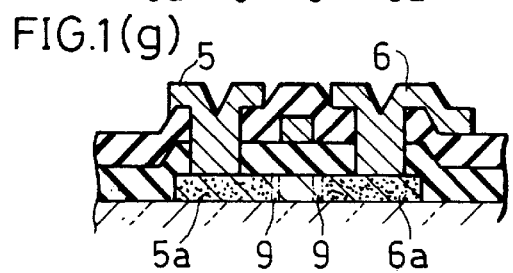
Figure 1H:
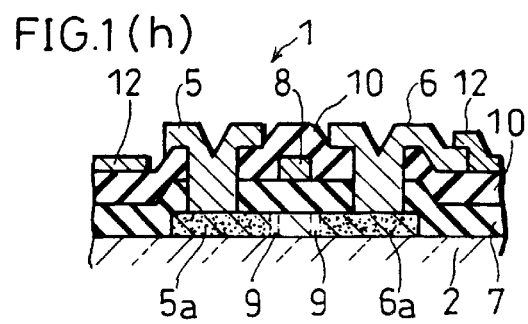
Figure 2:
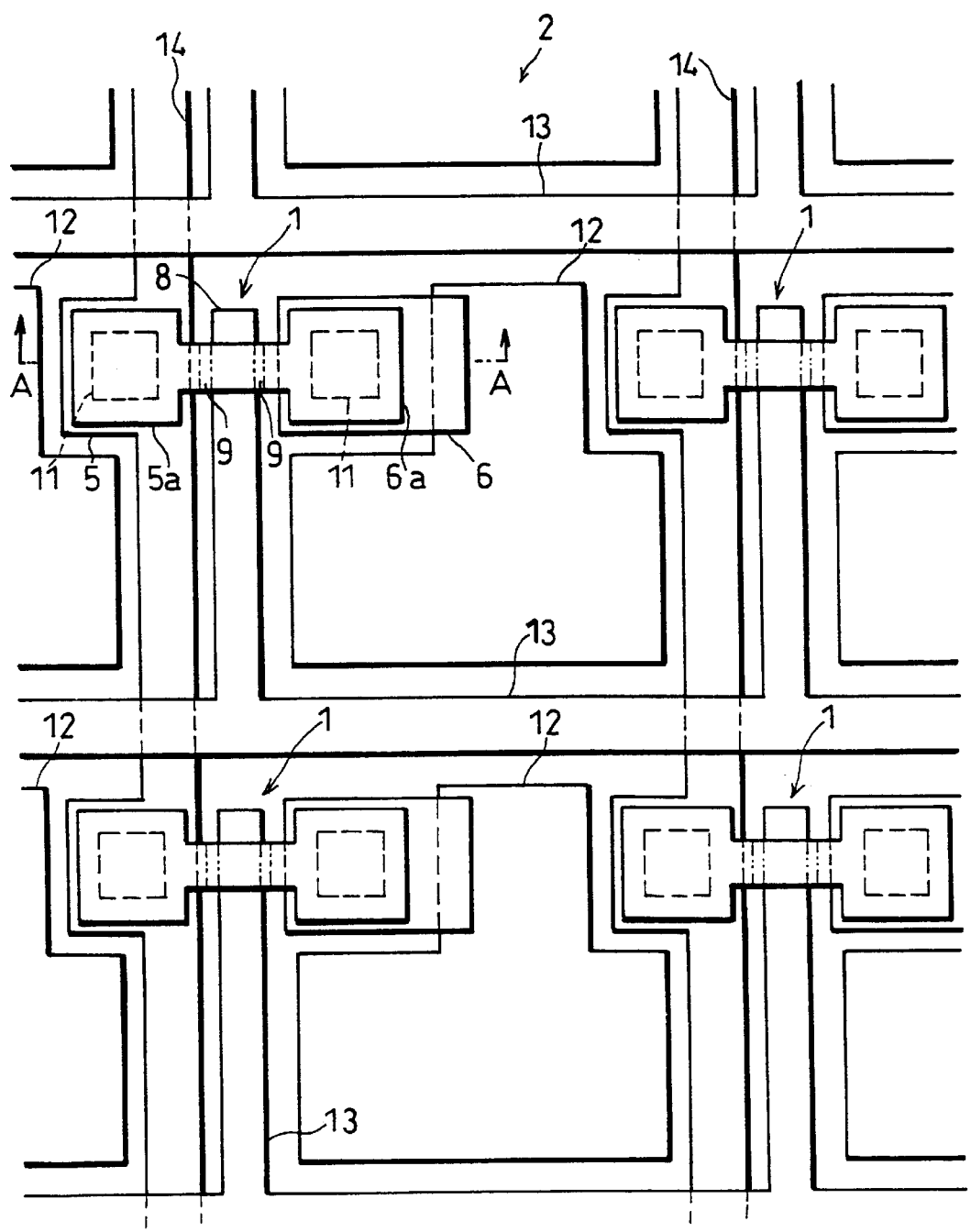
FIG. 2 is a bottom view showing a part of a panel substrate of a liquid crystal display device having a plurality of the above thin film transistors.
Figure 3:
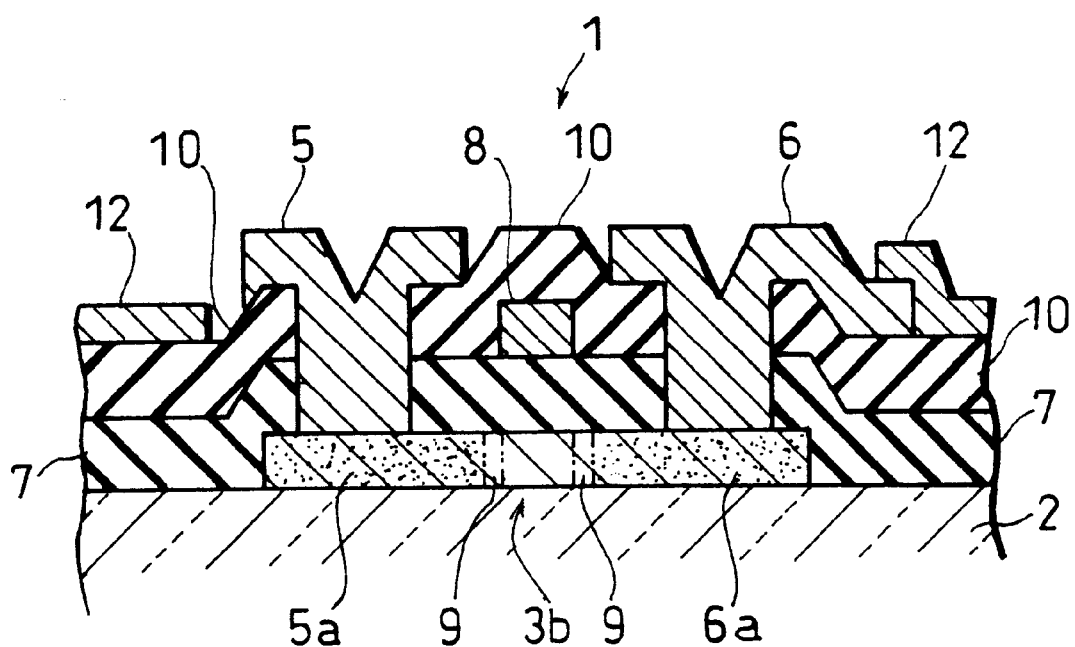
FIG. 3 is a cross section of the above thin film transistor taken on line A—A of FIG. 2.

Referring to FIGS. 1 through 3, the following description will describe an example embodiment of the present invention.

FIGS 1(*a*) through 1(*h*) are views showing a fabrication sequence of a thin film transistor 1 of the present embodiment. FIG. 2 is a bottom view showing a part of a panel substrate of a liquid crystal display device having a plurality of the above thin film transistors 1's, and FIG. 3 is a cross section taken on line A—A of FIG. 2.

As shown in FIG. 2, the thin film transistors 1's are connected to pixel electrodes 12's provided in a matrix form on a substrate 2 to serve as switching elements for controlling the supply of an image signal into the pixel electrodes 12's, respectively. Also, a plurality of scanning signal lines (gate lines) 13's and a plurality of data signal lines (source lines) 14's for supplying an image signal are provided on the substrate 2 in such a manner to intersect with each other if seen from a plan view. Each scanning signal 13 is formed as an integral part of a gate electrode 8 while each data signal line 14 is formed as an integral part of a source electrode 5, and the both the electrodes 5 and 8 will be explained below.

The above thin film transistor 1 is of the structure show n in FIG. 3. To be more specific, a gate dielectric film 7, the gate electrode 8, an interlayer dielectric film 10 are sequentially layered on a polycrystalline semiconductor film (P—Si) 3b in a vertical direction. Further, the source electrode 5 and a drain electrode 6 are formed respectively at two contact holes, which will be described below. The polycrystalline semiconductor film 3b has a channel region, and a source region 5a and a drain region 6a in the two opposing sides of the channel region, respectively. The channel region also has two offset regions 9's in the two opposing sides of a region below the gate electrode 8. Further, the drain electrode 6 is connected to the nearest pixel electrode 12.

In the fabrication process of the thin film transistor 1, as shown in FIG. 1(a), an amorphous semiconductor film (α-Si) 3a of 30–150 nm thick is formed on the substrate 2, which is a glass substrate or a substrate covered with a dielectric film, and the amorphous semiconductor film 3a is made into a predetermined pattern (FIG. 1(b)).

Then, as shown in FIG. 1 (c), a doping mask (ion implantation mask) is made out of a photoresist film 4 on the amorphous semiconductor film 3a over a portion which will be made into a channel region to shield this particular portion when ions are doped. The mask is formed in such a manner to shield a portion larger than the gate electrode 8 in width (gate length), which will be formed above in a step below. The mask, which determines the size of the shielded portion, is designed by pre-calculating the accuracy of the alignment and etching, so that a region where a dopant (impurity) is doped through ion doping and the gate electrode 8 do not overlap.

After the doping mask is made out of the photoresist film 4 in the aforementioned manner, the ion doping is carried out to form two impurity doped regions 21's. To be more specific, a dopant, for example, phosphorous representing a pentavalent element or boron representing a trivalent element, is doped into the amorphous semiconductor film 3a to a $1\times10^{15}/cm^2$-$1\times10^{17}/cm^2$ dose at an accelerating voltage of 10 kV–70 kV.

Next, as shown in FIG. 1(d), after the photoresist film 4 is removed, for example, an excimer laser beam is irradiated, so that the impurity doped regions 21's are activated to diffuse ions, and concurrently, the amorphous semiconductor film 3a including the portion which will be made into the channel region is developed into the polycrystalline semiconductor film (P—Si)3b. As a result, the two impurity doped regions 21's are made into the source region 5a and drain region 6a, respectively.

Next, as shown in FIG. 1(e), a dielectric film of approximately 100 nm thick is made out of $SiO_2$ or the like through CVD (Chemical Vapor Deposition), CVD using TEOS (Tetra-Ethoxy-Ortho-Silicate), or sputtering as the gate dielectric film 7. Subsequently, atop of the gate dielectric film 7, a film of approximately 200 nm thick is made out of a conductive material, for example, metal, such as Si, Ta, Nb, Al, doped in either an n-type or p-type, and an ITO (Indium Tin Oxide). Then, the resulting film is made into a predetermined pattern to form the gate electrode 8.

Here, as previously mentioned, the mask used in the ion doping is designed in such a manner that the region into which the impurity is doped does not overlap the gate electrode 8 and that the mask shields a portion larger than the gate electrode 8 in width. Thus, the gate electrode 8 overlaps neither the source region 5a nor drain region 6a. Further, it has become possible to form the two dopant-free offset regions 9's in the polycrystalline semiconductor 3b respectively between the source region 5a and drain region 6a and the region below the gate electrode 8.

Next, a film of approximately 300–400 nm thick is made out of SiNx, $SiO_2$ or the like through CVD, CVD using TEOS, or sputtering on the entire substrate as the interlayer dielectric film 10. Then, contact holes 11's are made by making the interlayer dielectric film 10 and gate dielectric film 7 into a predetermined pattern together (FIG. 1(f)). Next, a film of 500–600 nm thick is made out of a conductive material, for example, metal, such as Al and Mo, and an ITO. The resulting film is made into a predetermined pattern to form the source electrode 5 and drain electrode 6 (FIG. 1(g)). Further, a pixel electrode 12 is formed near the thin film transistor 1 thus fabricated in such a manner to have physical contact to the drain electrode 6 (FIG. 1(h)). The pixel electrode 12 is made of a transparent conductive film, such as an ITO film.

In the thin film transistor 1 fabricated in the above manner, the gate electrode 8 overlaps neither the source region 5a nor drain region 6a. Thus, it has become possible to prevent the degradation of the characteristics, especially the OFF-state characteristics, of the thin film transistor 1 and reduce the OFF-state current. In addition, having the offset regions 9's can further reduce the OFF-state current. Thus, the resulting thin film transistor 1 can prevent display defects, such as a flicker, and hence, can be suitably employed in a liquid crystal display device.

Second Embodiment

Figure 4:
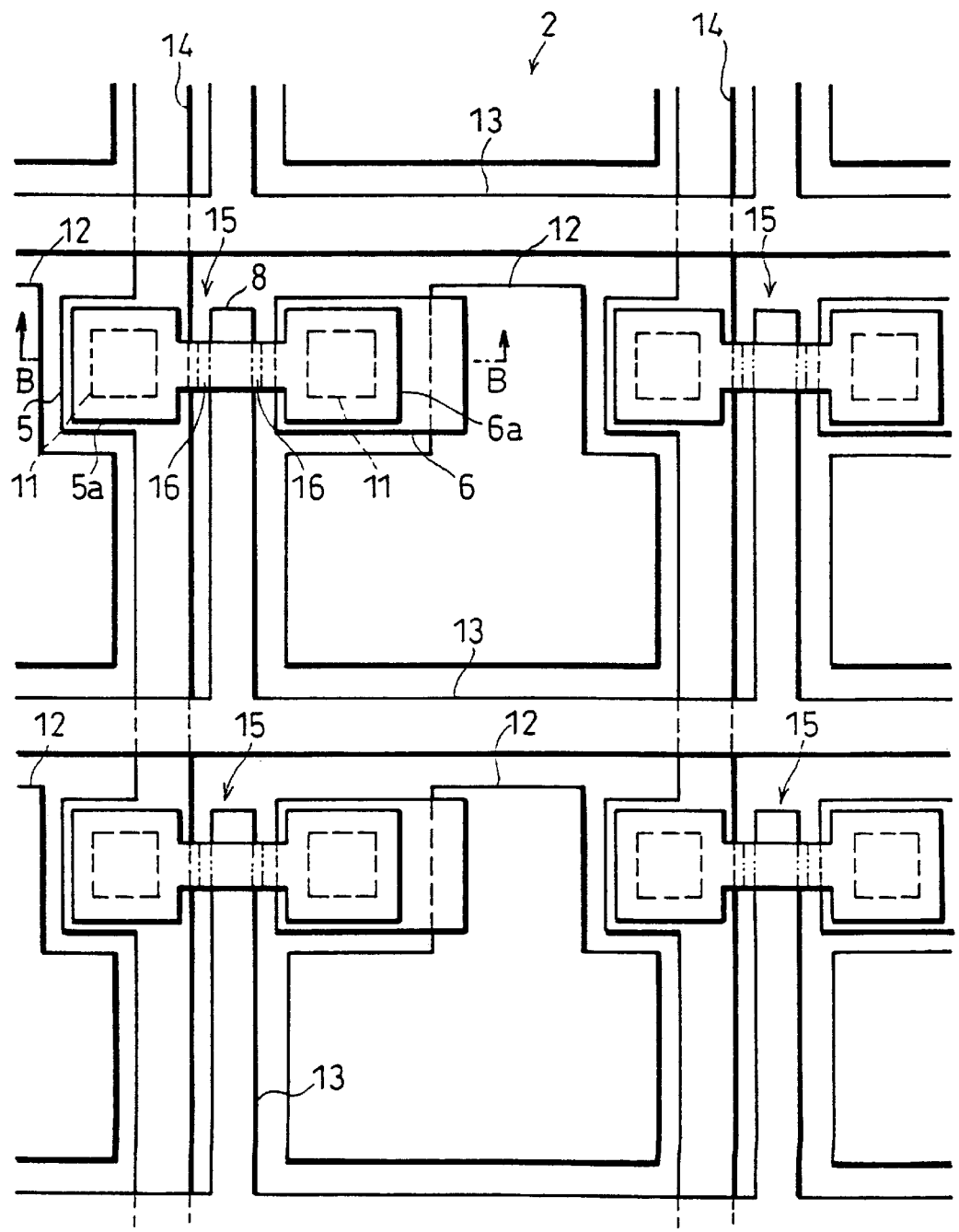
FIG. 4 is a bottom view showing a part of a panel substrate of a liquid crystal display device having a plurality of other example thin film transistors of the present invention.
Figure 5:
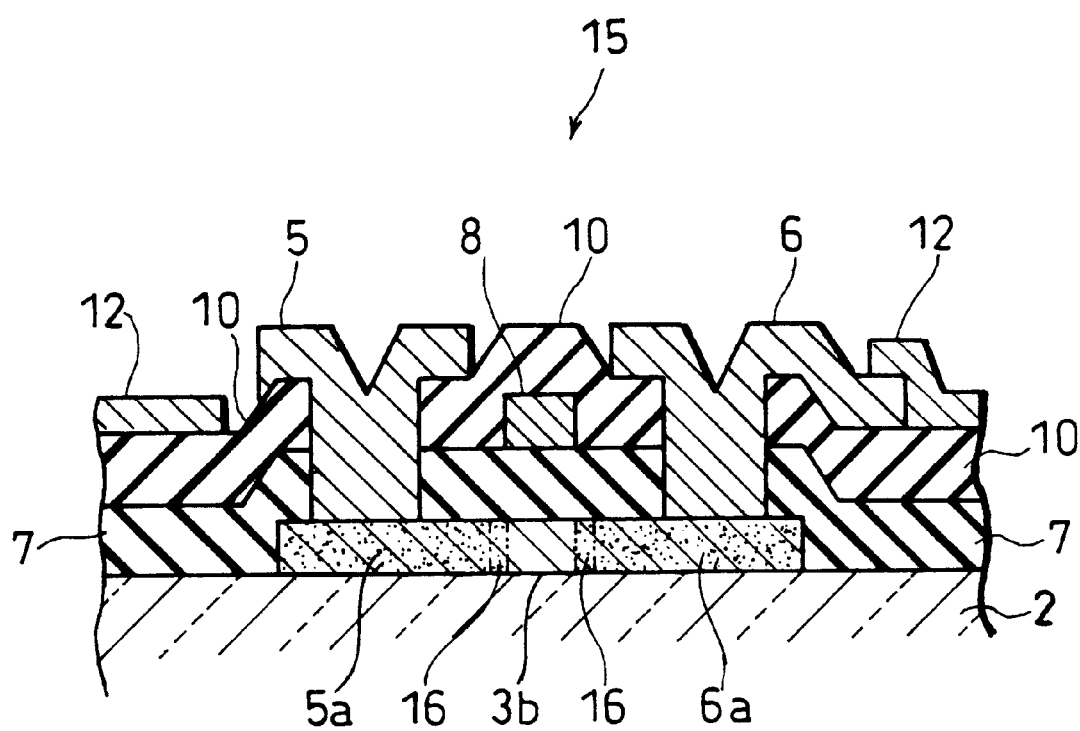
FIG. 5 is a cross section of the above thin film transistor taken on line B—B of FIG. 4.

Referring to FIGS. 4 through 6, the following description will describe an example embodiment of the present invention. Hereinafter, like components are labeled with like reference numerals with respect to the first embodiment, and the description of these components is not repeated for the explanation's convenience.

FIG. 4 is a bottom view showing a part of a panel substrate of a liquid crystal display device having a plurality of thin film transistors 15's of the present embodiment. FIG. 5 is a cross section taken on line B—B of FIG. 4, and FIGS. 6(a) through 6(i) are views showing a fabrication sequence of the thin film transistor 15.

As shown in FIG. 5, the thin film transistor 15 is of the same structure as the thin film transistor 1 of the first embodiment except that the offset regions 9's are replaced with LDD (Lightly Doped Drain) regions 16's having a lower dopant concentration than the source region 5a and drain region 6a.

Also, as to the fabrication sequence, the sequence up to the step of forming the gate electrode 8 of the thin film transistor 15 shown in FIGS. 6(a) through 6(e) is the same as that of the thin film transistor 1 explained in the first embodiment with reference to FIG. 1(a) through 1(e). Thus, only the steps beyond will be explained in the following.

Figure 6A:
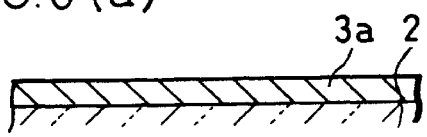
FIGS. 6(*a*) through 6(*i*) are views showing a fabrication sequence of the above thin film transistor.
Figure 6B:
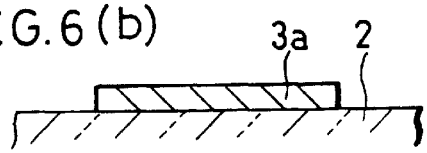
Figure 6C:
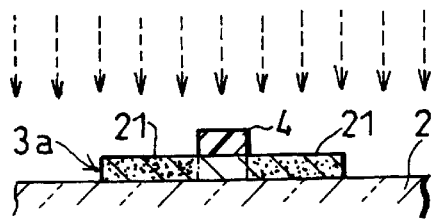
Figure 6D:
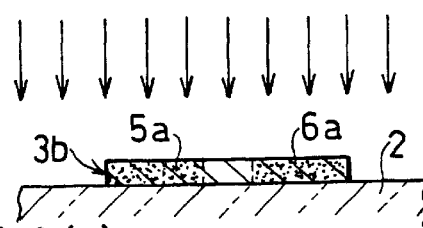
Figure 6E:
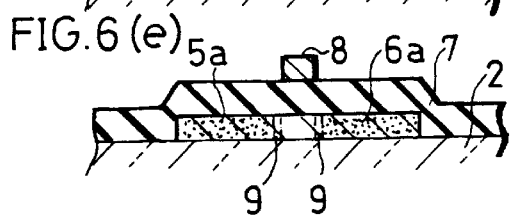
Figure 6F:
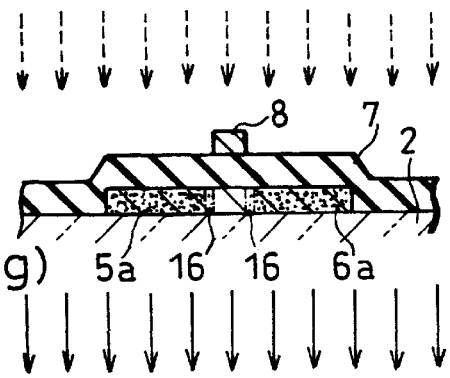
Figure 6G:
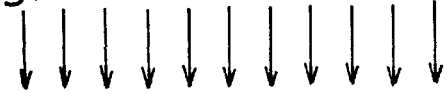
Figure 6H:
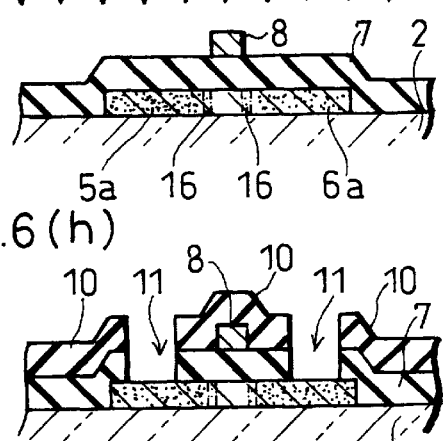
Figure 6I:
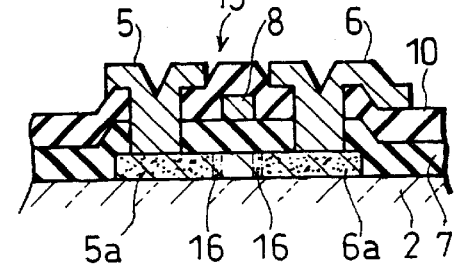

As shown in FIG. 6(f), after the gate electrode 8 is formed, second ion doping is carried out using the gate electrode 8 as a doping mask. To be more specific, the same dopant doped into the source region 5a and drain region 6a is doped into regions including the offset regions 9's to a light dose of $1\times10^{12}/cm^2$-$1\times10^{15}/cm^2$ at an accelerating voltage of 10 kV–70 kV. Subsequently, as shown in FIG. 6(g), the region into which the impurity has been doped is activated through, for example, irradiation of an excimer laser beam.

The offset regions 9's are transformed into the LDD regions 16's through the ion implantation at a lower concentration. Also, the fact that this ion implantation is carried out using the gate electrode 8 as a mask means that a self-alignment method is adopted. Thus, the LDD regions 16's and gate electrode 8 never overlap.

Next, like the fabrication sequence of the thin film transistor 1, a film of approximately 300–400 nm thick is made out of SiNx, SiO$_2$ or the like through CVD, CVD using TEOS, or sputtering on the entire substrate as the interlayer dielectric film 10. Then, contact holes 11's are made by making the interlayer dielectric film 10 and gate dielectric film 7 into a predetermined pattern together (FIG. 6(h)). Then, a film of 500–600 nm thick is made out of a conductive material, for example, metal, such as Al and Mo, and an ITO. The resulting film is made into a predetermined pattern to form the source electrode 5 and drain electrode 6 (FIG. 6(i)). Further, a pixel electrode 12 is formed near the thin film transistor 15 thus fabricated in such a manner to have physical contact to the drain electrode 6 (FIGS. 4 and 5). The pixel electrode 12 is made of a transparent conductive film, such as an ITO film.

In the thin film transistor 15 fabricated in the aforementioned manner, the gate electrode 8 overlaps neither the source region 5a nor drain region 6a; moreover, the gate electrode 8 does not overlap the LDD regions 16's, either. Accordingly, the OFF-state current and an ON-state current drop of the thin film transistor 15 can be reduced. Thus, the resulting thin film transistor 15 renders excellent ON- and OFF-state characteristics. Also, the resulting thin film transistor 15 can prevent display defects, such as flickers, and hence, can be suitably employed in a liquid crystal display device.

Third Embodiment

Referring to FIGS. 7 through 10, the following description will describe a further example embodiment of the present invention. Hereinafter, like components are labeled with like reference numerals with respect to the first embodiment, and the description of these components is not repeated for the explanation's convenience.

Figure 7:
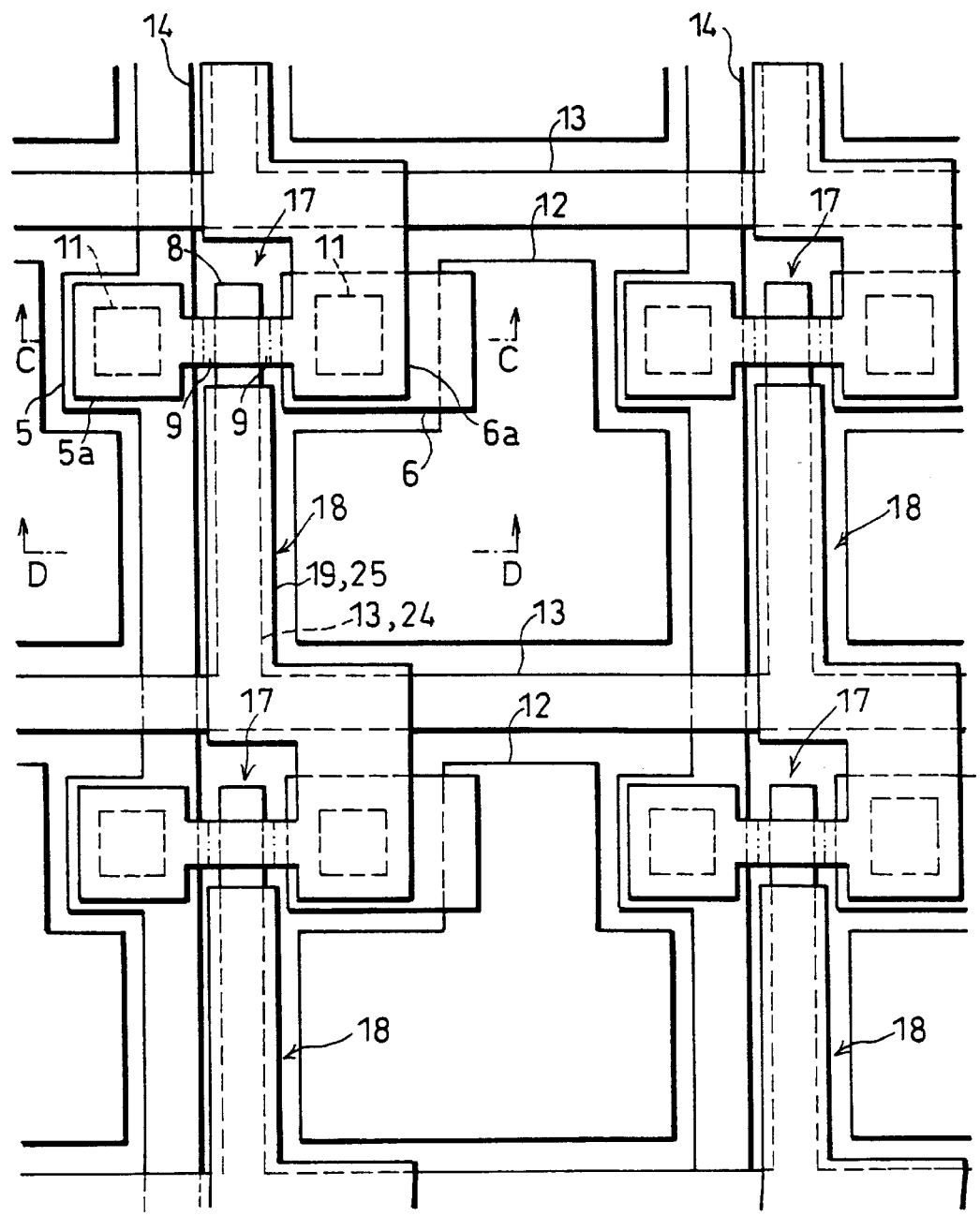
FIG. 7 is a bottom view showing a part of a panel substrate of a liquid crystal display device having a plurality of further example thin film transistors of the present invention and a plurality of auxiliary capacitance.
Figure 8:
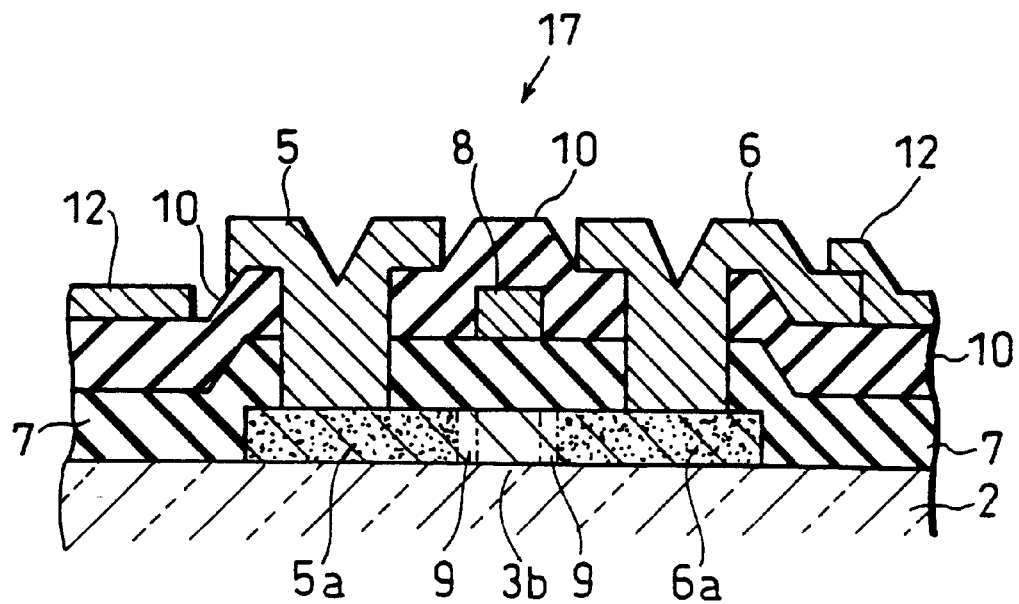
FIG. 8 is a cross section of the above thin film transistor taken on line C—C of FIG. 7.
Figure 9:
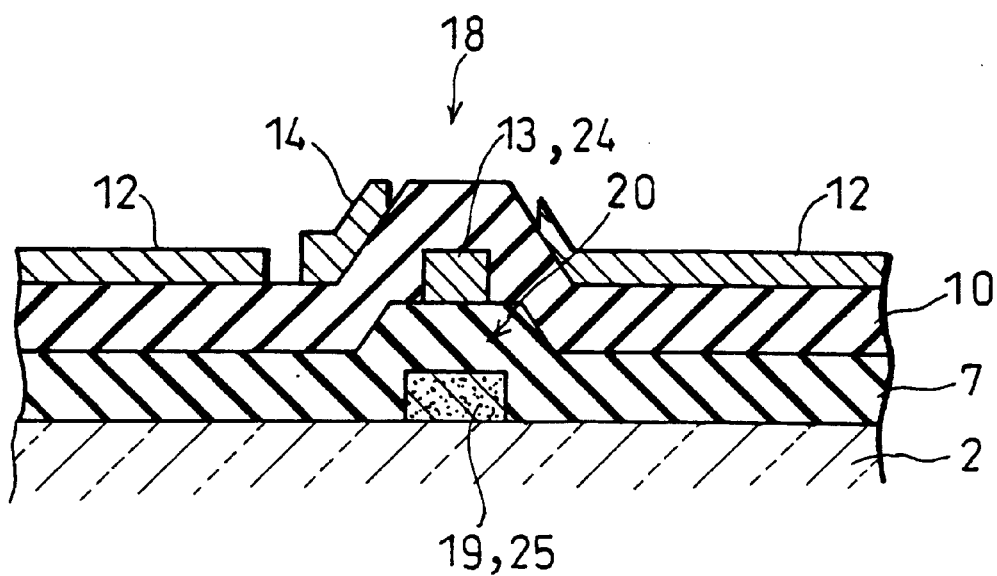
FIG. 9 is a cross section of the above auxiliary capacitance taken on line D—D of FIG. 7.

FIG. 7 is a bottom view showing a part of a panel substrate of a liquid crystal display device having a plurality of thin film transistors 17's and a plurality of auxiliary capacitances 18's of the present embodiment. FIG. 8 is a cross section of the thin film transistor 17 taken on line C—C of FIG. 7, while FIG. 9 is a cross section of the auxiliary capacitance 18 taken on line D—D of FIG. 7. FIGS. 10(a) through 10(g) are views showing a fabrication sequence of the thin film transistor 17 and auxiliary capacitance 18 fabricated concurrently.

As shown in FIG. 8, the thin film transistor 17 is of the same structure as the thin film transistor 1 of the first embodiment except that the drain region 6a additionally has an extended portion 25 as shown in FIG. 7. FIGS. 7 and 9 show the structure of the auxiliary capacitance 18 fabricated concurrently with the thin film transistor 17. To be more specific, the extended portion 25 is formed to serve as an electrode 19, one of the two electrodes of the auxiliary capacitance 18, while the scanning signal line 13 of the preceding stage is formed to also serve as the other electrode 24. Further, a dielectric portion 20 interposed between the two electrodes 19 and 24 is made of the same material as the gate dielectric film 7. The auxiliary capacitance 18 is provided in parallel to the liquid crystal capacitance of each pixel to upgrade the data withholding characteristics.

The fabrication sequence of the thin film transistor 17 is shown in FIGS. 10(a) through 10(g), which is the same as the fabrication sequence of the thin film transistor 1 of the first embodiment explained with reference to FIGS. 1(a) through 1(g). Note that, however, the auxiliary capacitance 18 is fabricated concurrently with the thin film transistor 17.

Figure 10A:
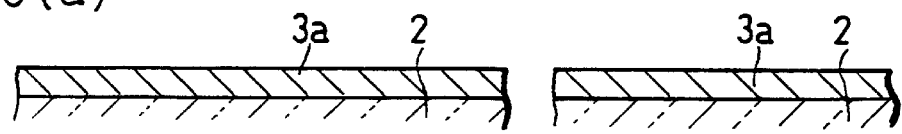
FIGS. 10(*a*) through 10(*g*) are views showing a fabrication sequence of the above thin film transistor and auxiliary capacitance.
Figure 10B:
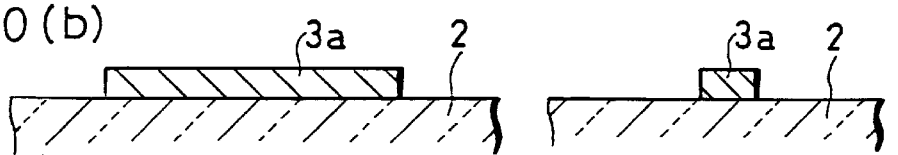

In the fabrication sequence of the thin film transistor 17 and auxiliary capacitance 18, as shown in FIG. 10(a), an amorphous semiconductor film (α-Si) 3a of 30–150 nm thick is formed on the substrate 2, which is a glass substrate or a substrate covered with a dielectric film, and the amorphous semiconductor film 3a is made into a predetermined pattern in regions where the thin film transistor 17 and auxiliary capacitance 18 will be fabricated concurrently (FIG. 10(b)). Here, as shown in FIG. 7, the amorphous semiconductor film 3a is patterned in such a manner that the extended portion 25 extends from a portion where the drain region 6a will be made to another region where the nearest auxiliary capacitance 18 will be fabricated.

Figure 10C:
Figure 10D:
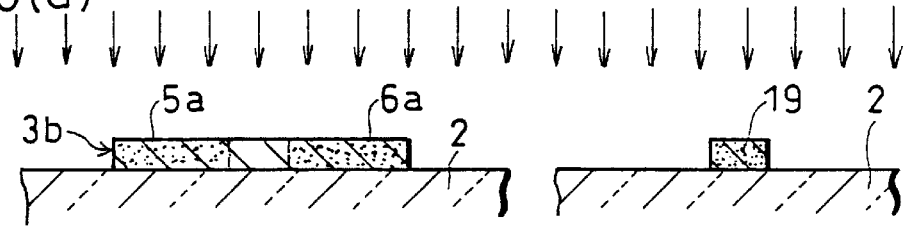

Then, as shown in FIG. 10(c), like the first embodiment, a doping mask is made out of a photoresist film 4 on the amorphous semiconductor film 3a over the region where the thin film transistor 17 will be fabricated. The mask is designed and the size of the portion shielded by the mask is determined in the same manner as the first embodiment.

Then, ion doping is carried out in both the regions where the thin film transistor 17 and auxiliary capacitance 18 will be fabricated in the same manner as the first embodiment to form impurity doped regions 21's, two in the former, one in the latter. Next, after the photoresist film 4 on the region where the thin film transistor 17 will be fabricated is removed, for example, an excimer laser beam is irradiated onto the regions where the thin film transistor 17 and auxiliary capacitance 18 will be fabricated, so that the impurity doped regions 21's are activated to diffuse the ions, and concurrently, the amorphous semiconductor film 3a is developed into the polycrystalline semiconductor film 3b (FIG. 10(d)). As a result, the impurity doped regions 21's are respectively made into the source region 5a, drain region 6a, and electrode 19 of the auxiliary capacitance 18 at the same time.

Figure 10E:
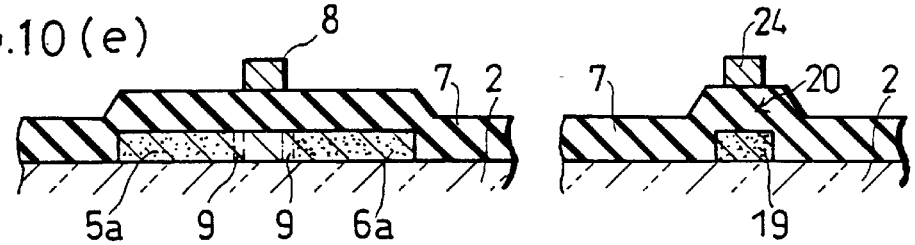

Next, as shown in FIG. 10(e), like the first embodiment, the gate dielectric film 7 is formed on the region where the thin film transistor 17 will be fabricated, and concurrently, the dielectric portion 20 is formed on the region where the auxiliary capacitance 18 will be fabricated. To be more specific, a dielectric film of approximately 100 nm thick is made out of SiO$_2$ or the like through CVD, CVD using TEOS, or sputtering to form the dielectric portion 20. Subsequently, the gate electrode 8 is formed on the region where the thin film transistor 17 will be fabricated in the same manner as the first embodiment, and concurrently, a scanning signal line 13 of the preceding stage is formed on the region where the auxiliary capacitance 18 will be fabricated to also serve as the other electrode 24. More specifically, atop of the dielectric portion 20, a film of approximately 200 nm thick is made out of a conductive material, for example, metal, such as Si, Ta, Nb, Al, doped into either n-type or p-type, and an ITO. Then, the resulting film is made into a predetermined pattern to form the scanning signal line 13. Since the gate electrode 8 is formed on the region where the thin film transistor 17 will be fabricated in the same manner as the first embodiment, the gate electrode 8 overlaps neither the source region 5a nor drain region 6a. In addition, the offset regions 9's can be made concurrently.

Figure 10F:
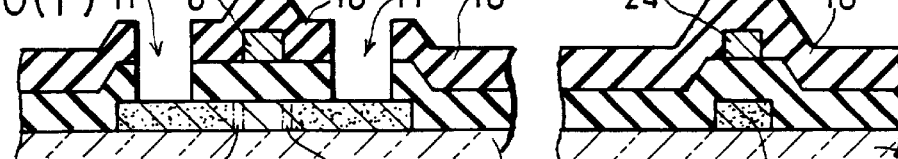
Figure 10G:
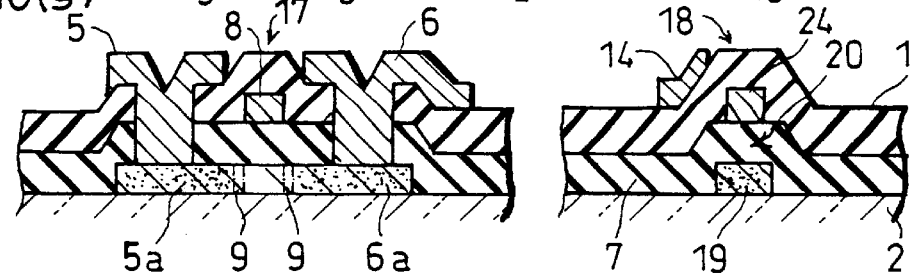

Next, as shown in FIG. 10(f), a film of approximately 300–400 nm thick is made out of SiNx, $SiO_2$ or the like through CVD, CVD using TEOS, or sputtering on the regions where the thin film transistor 17 and auxiliary capacitance 18 will be fabricated as the interlayer dielectric film 10. Then, contact holes 11 are made by making the interlayer dielectric film 10 and gate dielectric film 7 into a predetermined pattern together in the region where the thin film transistor 17 will be fabricated. Next, as shown in FIG. 10(g), in the region where the thin film transistor 17 will be fabricated, a film of 500–600 nm thick is made out of a conductive material, for example, metal, such as Al and Mo, and an ITO. The resulting film is made into a predetermined pattern to form the source electrode 5 and drain electrode 6. At the same time, a data signal line 14 is formed near the auxiliary capacitance 18. Further, a pixel electrode 12 is formed near the thin film transistor 17 thus fabricated in such a manner to have physical contact to the drain electrode 6 (FIGS. 7 and 8). The pixel electrode 12 is made of a transparent conductive film, such as an ITO film.

In the thin film transistor 17 fabricated in the above manner, the gate electrode 8 overlaps neither the source region 5a nor drain region 6a. This arrangement makes it possible to prevent the degradation of the characteristics, especially the OFF-state characteristics, of the thin film transistor 17, and reduce the OFF-state current of the same. In addition, having the offset regions 9's can further reduce the OFF-state current. Thus, the resulting thin film transistor 17 can prevent display defects, such as a flicker, and hence can be suitably employed in a liquid crystal display device.

Also, according to the above fabrication sequence, when a plurality of the thin film transistors 17's and auxiliary transistors 18's are fabricated on a single panel substrate, the latter can be fabricated concurrently with the former in a single sequence. That is to say, the following components are formed concurrently during the fabrication sequence, respectively: (1) the source region 5a and drain region 6a of the thin film transistor 17, and the extended portion 25 of the drain region 6a which will serve as the electrode 19 of the auxiliary capacitance 18, (2) the gate dielectric film 7 of the thin film transistor 17 and the dielectric portion 20 of the auxiliary capacitance 18, and (3) the gate electrode 8 of the thin film transistor 17 and the scanning signal line 13 of the preceding stage which will also serve as the other electrode 24 of the auxiliary capacitance 18. Fabricating the auxiliary capacitance(s) 18('s) concurrently with the thin film transistor(s) 17('s) in a single sequence can simplify the overall fabrication sequence. Further, in a liquid crystal in which the thin film transistor 17 and auxiliary capacitance 18 are provided to each pixel, the data withholding characteristics of each pixel can be upgraded without increasing the number of the steps in the fabrication sequence.

Fourth Embodiment

Referring to FIG. 11, the following description will describe still another example embodiment of the present invention. Hereinafter, like components are labeled with like reference numerals with respect to the third embodiment, and the description of these components is not repeated for the explanation's convenience.

FIGS. 11(a) through 11(d) are views showing a part of a fabrication sequence of a thin film transistor 22 and an auxiliary capacitance 23 of the present embodiment which are fabricated concurrently. The thin film transistor 22 is of the same structure as the thin film transistor 15 of the second embodiment except that the drain region 6a additionally includes the extended portion 25 like the thin film transistor 17 of the third embodiment. Also, the fabrication sequence of the thin film transistor 22 is the same as that of the thin film transistor 15 of the second embodiment. Note that, however, the auxiliary capacitance 23 is fabricated concurrently with the thin film transistor 22.

In the fabrication sequence of the thin film transistor 22 and auxiliary capacitance 23, the sequence up to the steps of forming the gate electrode 8 of the thin film transistor 22, the scanning signal line 13 of the preceding stage which will also serve as the other electrode 24 of the auxiliary capacitance 23 is the same as the fabrication sequence of the thin film transistor 17 of the third embodiment explained with reference to FIGS. 10(a) through 10(e).

Figure 11A:
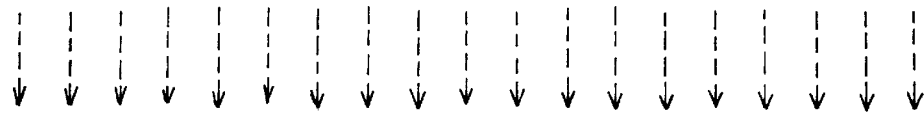
FIGS. 11(*a*) through 11(*d*) are views showing a fabrication sequence of still another example thin film transistor of the present invention and another example auxiliary capacitance.
Figure 11B:
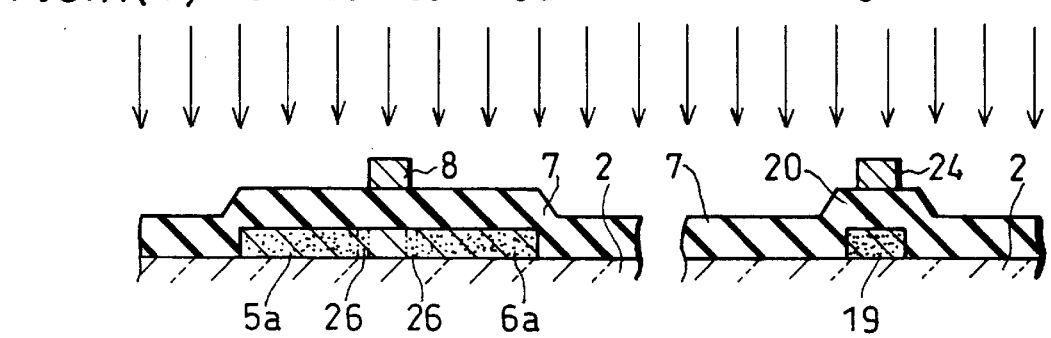

In the present fabrication sequence, as shown in FIG. 11(a), after the gate electrode 8 and the scanning signal line 13 of the preceding stage which will also serve as the electrode 24 are formed, the same impurity doped into the source region 5a and drain region 6a is doped into a region including the offset regions 9's using the gate electrode 8 as a mask to a light dose of $1\times10^{12}/cm^2$-$1\times10^{15}/cm^2$ at an accelerating voltage of 10 kv–70 kV through ion implantation. Then, as shown in FIG. 11(b), the impurity doped region is activated through, for example, irradiation of an excimer laser beam.

The offset regions 9's are transformed into LDD regions 26's through the ion implantation at a lower concentration. Also, the fact that this ion implantation is carried out using the gate electrode 8 as a mask means that a self-alignment method is adopted. Thus, the LDD regions 26's and gate electrode 8 never overlap.

Figure 11C:
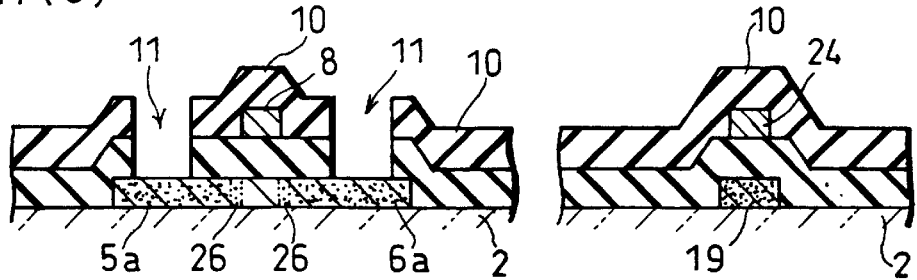
Figure 11D:
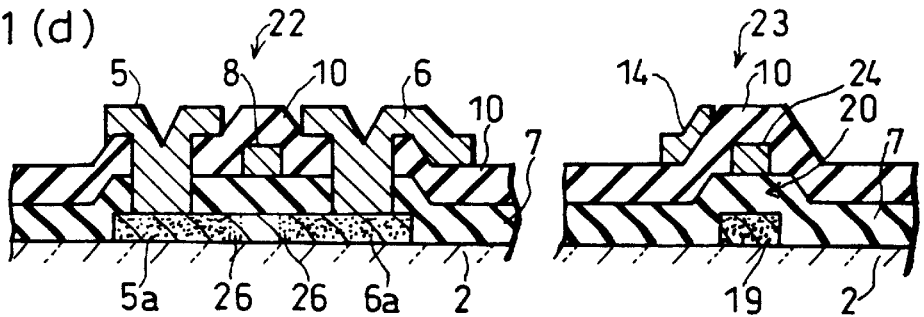
Figure 12:
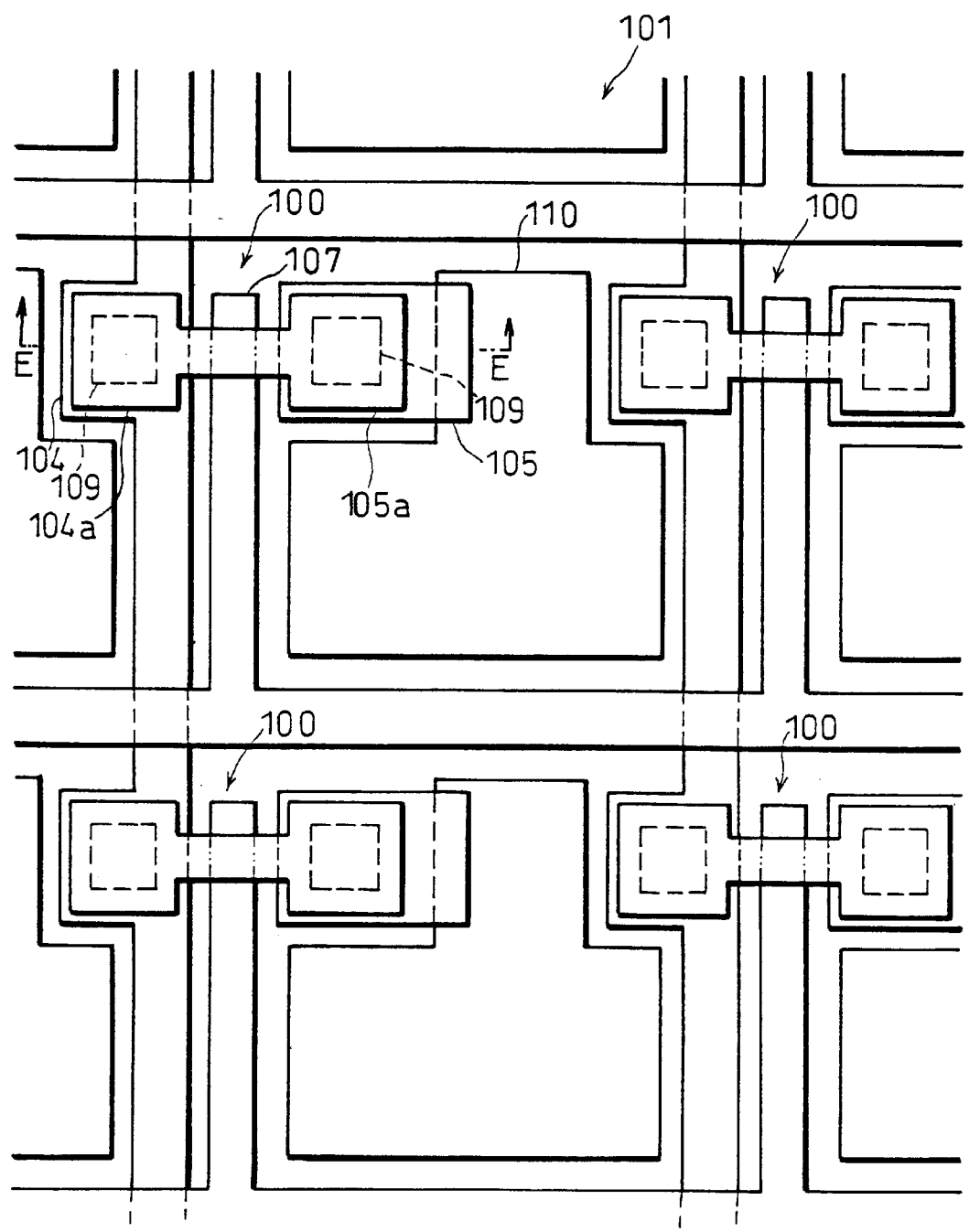
FIG. 12 is a bottom view showing a part of a panel substrate of a liquid crystal display device having a plurality of conventional thin film transistors.
Figure 13:
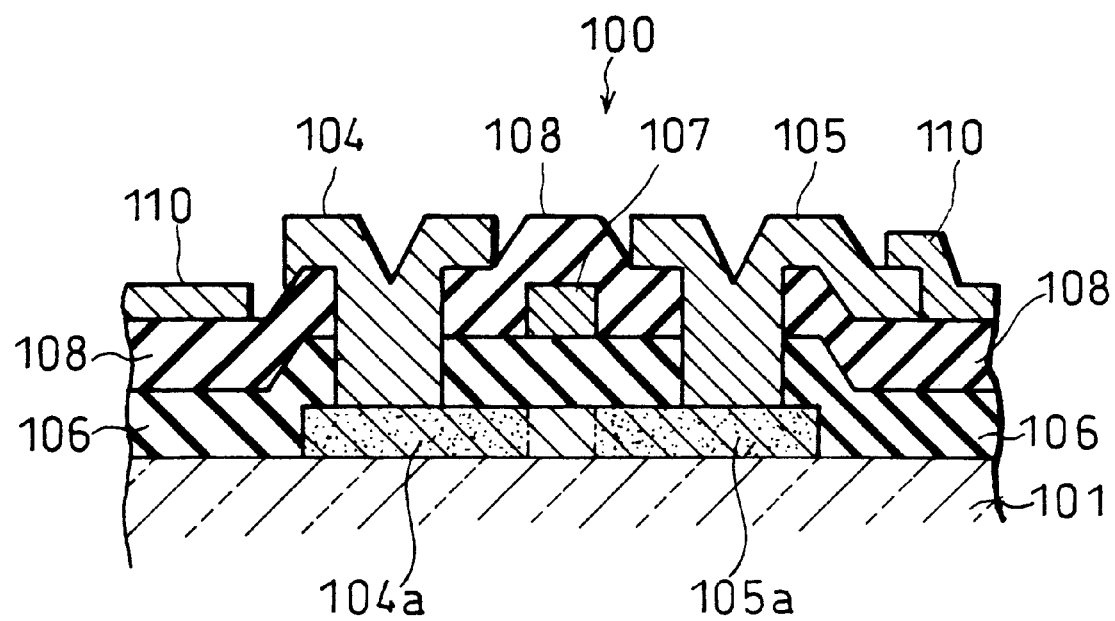
FIG. 13 is a cross section of the above conventional thin film transistor taken on line E—E of FIG. 12.
Figure 14A:
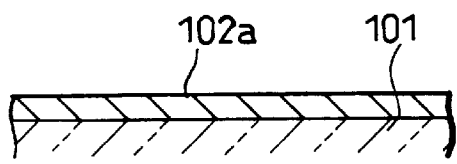
FIGS. 14(*a*) through 14(*h*) are views showing a fabrication sequence of the above conventional thin film transistor.
Figure 14B:
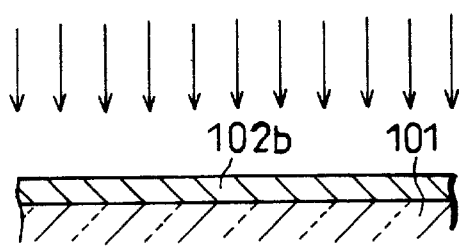
Figure 14C:
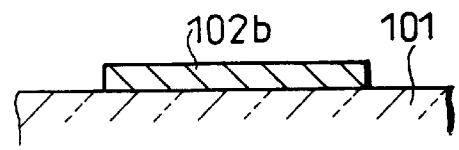
Figure 14D:
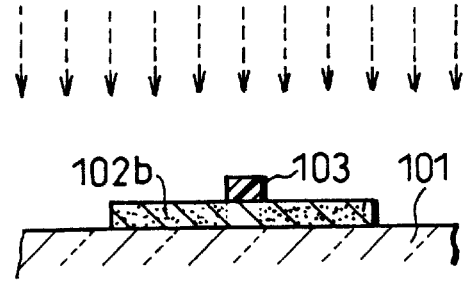
Figure 14E:
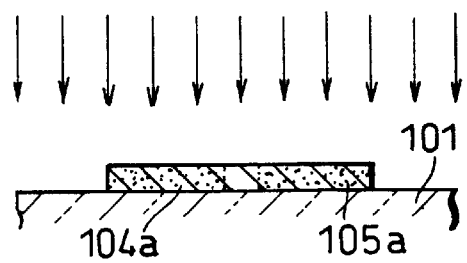
Figure 14F:
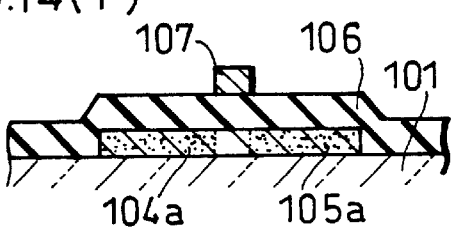
Figure 14G:
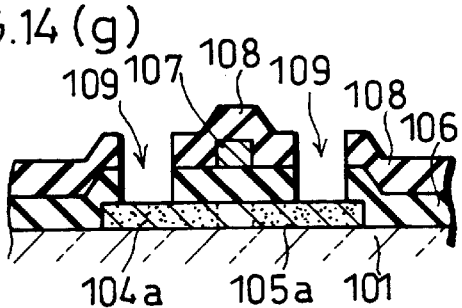
Figure 14H:
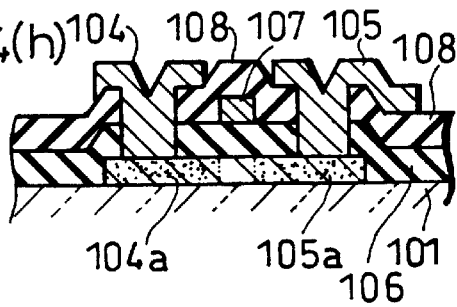
Figure 15A:
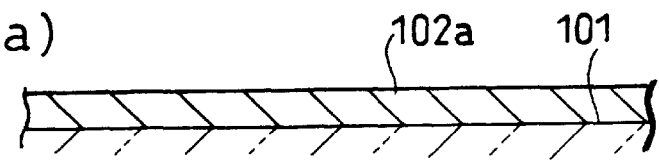
FIGS. 15(*a*) through 15(*e*) are views showing another fabrication sequence of the conventional thin film transistor.
Figure 15B:
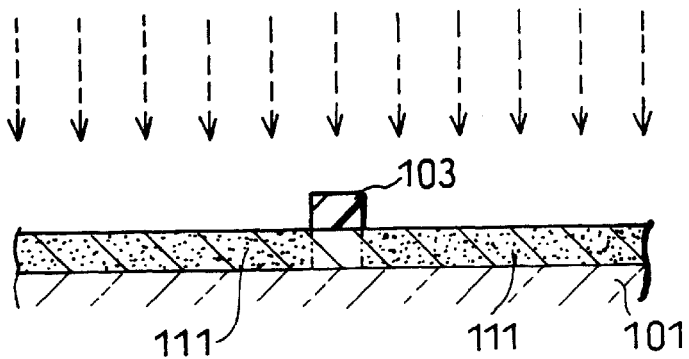
Figure 15C:
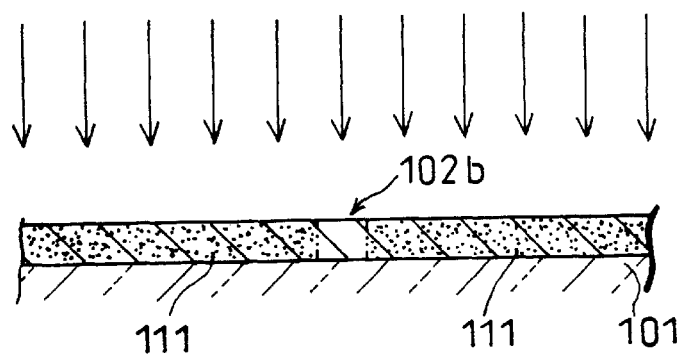
Figure 15D:
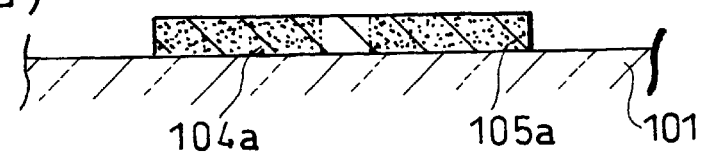
Figure 15E:
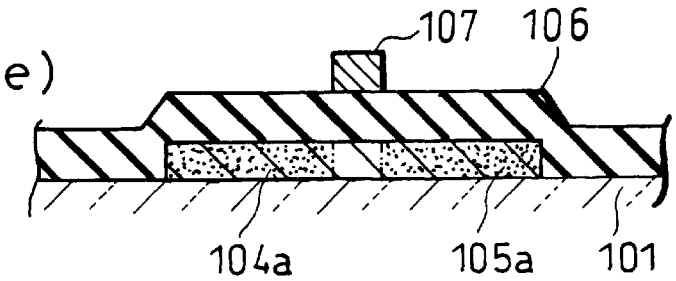
Figure 16:
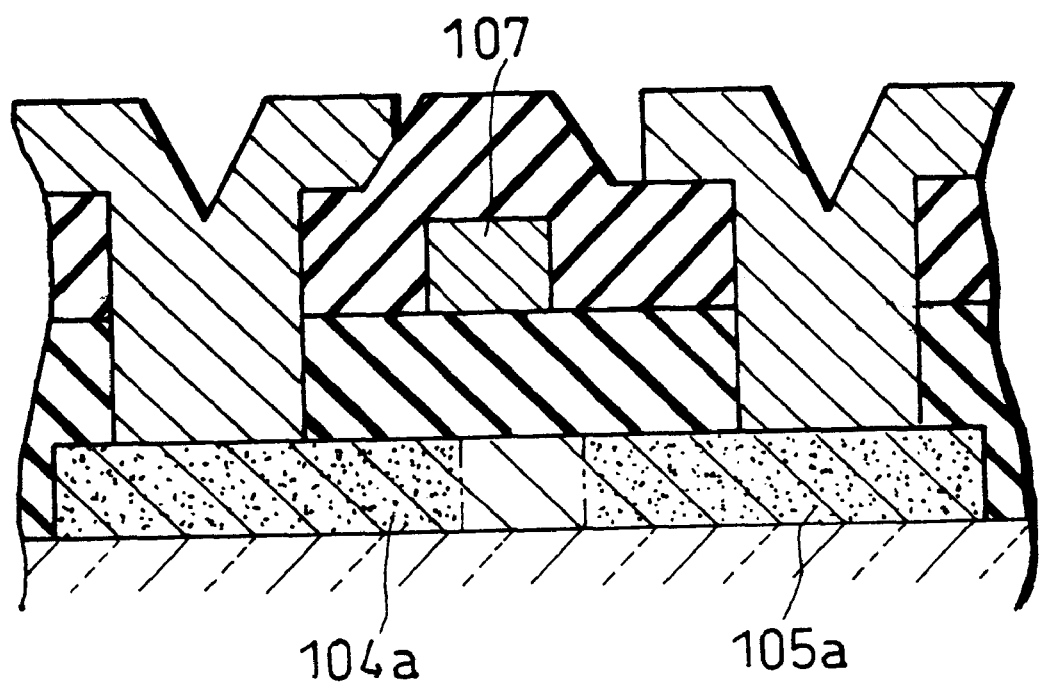
FIG. 16 is a view explaining a gate electrode overlapping an upper layer of an impurity doped region of the conventional thin film transistor.

Next, as shown in FIG. 11(c), a film of approximately 300–400 nm thick is made out of SiNx, $SiO_2$ or the like through CVD, CVD using TEOS, or sputtering on regions where the thin film transistor 22 and auxiliary capacitance 23 will be fabricated as the interlayer dielectric film 10. Then, contact holes 11's are made by making the interlayer dielectric film 10 and gate dielectric film 7 into a predetermined pattern together in the region where the thin film transistor 22 will be fabricated. Then, as shown in FIG. 11(d), a film of 500–600 nm thick is made out of a conductive material, for example, metal, such as Al and Mo, and an ITO, on the region where the thin film transistor 22 will be fabricated. The resulting film is made into a predetermined pattern to form the source electrode 5 and drain electrode 6. At the same time, a data signal line 14 is formed near the auxiliary capacitance 23. Further, a pixel electrode 12 is formed near the thin film transistor 22 thus fabricated in such a manner to have physical contact to the drain electrode 6. The pixel electrode 12 is made of a transparent conductive film, such as an ITO film.

In the thin film transistor 22 fabricated in the above fabrication process, the gate electrode 8 overlaps neither the source region 5a nor drain region 6a; moreover, the gate electrode 8 does not overlap the LDD regions 26's either. Therefore, it has become possible to reduce the OFF-state current and an ON-state current drop of the thin film transistor 22. Thus, the resulting thin film transistor 22 renders excellent ON- and OFF-state characteristics. Also, the resulting thin film transistor 22 can prevent display defects, such as a flicker, and hence, can be suitable employed in a liquid crystal display device.

Also, according to the above fabrication process, when a plurality of the thin film transistors 22's and a plurality of auxiliary capacitances 23's are fabricated on the panel substrate, the latter can be fabricated concurrently with the former in a single fabrication sequence like in the third embodiment, thereby simplifying the overall fabrication sequence. Further, in a liquid crystal display device in which the thin film transistor 22 and auxiliary capacitance 23 are provided to each pixel, the data withholding characteristics of each pixel can be upgraded without increasing the number of the steps in the fabrication sequence.

Further, in a so-called a Driver-Integrated TFT-LCD, in which a driving circuit, for outputting a scanning signal and a data signal respectively to the scanning signal line and data signal line, is formed as an integral part of the TFT substrate whose pixel portion has the thin film transistors formed as described above, thin film transistors in the driving circuit can be fabricated by any of the fabrication processes of the first through fourth embodiments. In other words, the type of the thin film transistor and the fabrication process of the same can be selected depending on the applications. For example, in case of a thin film transistor serving as a switching element of each pixel electrode and thereby requiring a lower OFF-state current, the thin film transistor 17 of the third embodiment is preferable, and in case of a thin film transistor employed for the driver (driving circuit) portion and thereby requiring a higher ON-state current, the thin film transistor 15 having the LDD structure of the second embodiment is preferable.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for fabricating a thin film transistor comprising the steps of:

(1) forming an amorphous semiconductor layer on a dielectric substrate;

(2) making an impurity doped region by carrying out ion doping while shielding a portion of said amorphous semiconductor layer, said shielded portion including at least a region over which a gate electrode is formed, said shielded portion being larger than said gate electrode formed above in width; and (3) making a drain region and a source region by crystallizing said amorphous semiconductor layer and activating said impurity doped region, said crystallization and impurity activation being carried out concurrently by one of irradiation of laser beams and heating after shielding is cleared, wherein one of said drain region and source region is made to have an extended portion, said extended portion serving as either electrode of a capacitor fabricated on said substrate.

2. The process of fabricating the thin film transistor as defined in claim 1, wherein a gate dielectric film of said thin film transistor and a dielectric portion of said capacitor are formed concurrently, and said gate electrode of said thin film transistor and the other electrode of said capacitor are formed concurrently.

3. The process of fabricating the thin film transistor as defined in claim 1, wherein a plurality of said thin film transistors are fabricated at one time in a driving circuit region on either panel substrate of an active matrix type liquid crystal display device.

4. A process for fabricating a thin film transistor comprising the steps of:

(1) forming an amorphous semiconductor layer on a dielectric substrate;

(2) making an impurity doped region by carrying out ion doping while shielding a portion of said amorphous semiconductor layer, said shielded portion including at least a region over which a gate electrode is formed, said shielded portion being larger than said gate electrode formed above in width;

(3) making a drain region and a source region by crystallizing said amorphous semiconductor layer and activating said impurity doped region, said crystallization and impurity activation being carried out concurrently by one of irradiation of laser beams and heating after shielding is cleared; and (4) carrying out a second ion doping at a lower concentration than said ion doping in said second step using said gate electrode as shielding means after said third step, wherein one of said drain region and source region is made to have an extended portion, said extended portion serving as either electrode of a capacitor fabricated on said substrate.

5. The process of fabricating the thin film transistor as defined in claim 4, wherein a gate dielectric film of said thin film transistor and a dielectric portion of said capacitor are formed concurrently, and said gate electrode of said thin film transistor and the other electrode of said capacitor are formed concurrently.

6. The process of fabricating the thin film transistor as defined in claim 4, wherein a plurality of said thin film transistors are fabricated at one time in a pixel region on either panel substrate of an active matrix type liquid crystal display device.

7. The process for fabricating the thin film transistor as defined in claim 1, wherein a mask is provided to shield said shielded portion in said second step, and said gate electrode does not overlap said drain region or said source region.

8. The process of fabricating the thin film transistor as defined in claim 4, wherein a dose amount of said second ion doping is in a range between 1/100 and 1/10000 of a dose amount of said ion doping in said second step.

* * * * *